United States Patent
Jiang et al.

(10) Patent No.: US 9,941,201 B1
(45) Date of Patent: Apr. 10, 2018

(54) MAGNETICALLY DECOUPLED INDUCTOR STRUCTURES

(71) Applicant: Altera Corporation, San Jose, CA (US)

(72) Inventors: Xiaohong Jiang, San Jose, CA (US); Nathaniel Wright Unger, San Jose, CA (US); Kyung Suk Oh, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 24 days.

(21) Appl. No.: 15/013,885

(22) Filed: Feb. 2, 2016

(51) Int. Cl.
| | |
|---|---|
| *H01L 27/08* | (2006.01) |
| *H01L 21/20* | (2006.01) |
| *H01L 23/522* | (2006.01) |
| *H01L 49/02* | (2006.01) |
| *H01L 23/528* | (2006.01) |

(52) U.S. Cl.
CPC ...... *H01L 23/5227* (2013.01); *H01L 23/5286* (2013.01); *H01L 28/10* (2013.01)

(58) Field of Classification Search
CPC .................................................. H01L 23/5227
USPC ........................................... 257/531; 438/381
See application file for complete search history.

(56) References Cited

U.S. PATENT DOCUMENTS

| | | | |
|---|---|---|---|
| 6,608,377 B2 | 8/2003 | Chang et al. | |
| 6,747,452 B1 | 6/2004 | Jectic et al. | |
| 7,154,161 B1 | 12/2006 | Blaschke et al. | |
| 7,259,639 B2 | 8/2007 | DeBhailis et al. | |
| 2006/0170071 A1* | 8/2006 | Imaoka | H01L 23/49838 257/531 |
| 2009/0096566 A1* | 4/2009 | Lee | H01F 17/0006 336/200 |
| 2012/0104574 A1* | 5/2012 | Boeck | H01L 23/49816 257/660 |
| 2012/0146741 A1* | 6/2012 | Yen | H01L 23/5223 333/25 |
| 2013/0038507 A1* | 2/2013 | Hamabe | H01Q 1/38 343/893 |
| 2013/0049730 A1* | 2/2013 | Kato | H01L 23/642 323/355 |
| 2013/0234911 A1* | 9/2013 | Lee | H01Q 21/28 343/893 |
| 2014/0015508 A1 | 1/2014 | Liang | |

(Continued)

*Primary Examiner* — Matthew Landau
*Assistant Examiner* — Igwe U Anya

(57) ABSTRACT

In one embodiment, an integrated circuit die includes first and second inductor structures, a first ground conductor, a second ground conductor and a conductive trace. The first ground conductor provides a first ground pathway for the first inductor structure. The second ground conductor provides a second ground pathway for the second inductor structure. The conductive trace coupled between the first and second ground conductors may magnetically decouple the first and second inductor structures. In addition, the integrated circuit die may also include conductive guard ring structures that surround the first and second inductor structures. One of the conductive guard ring structures may be connected to the first grounding pathway and the other conductive guard ring structure may be connected to the second grounding pathway. The conductive guard ring structures may further magnetically decouple the first and second inductor structures.

20 Claims, 8 Drawing Sheets

(56) References Cited

U.S. PATENT DOCUMENTS

2016/0006400 A1\* 1/2016 Mu ..................... H03F 1/0277
330/295

\* cited by examiner

MAGNETICALLY DECOUPLED INDUCTOR STRUCTURES

BACKGROUND

Integrated circuit dies often include one or more inductor structures. These inductor structures are used as components in various circuitry, such as inductor-capacitor (LC) oscillator circuitry, integrated voltage regulator circuitry, or compensation circuitry.

One of the problems that is caused by forming multiple inductor structures in an integrated circuit die is the potential degradation of certain electrical characteristics such as inductance or quality (Q) factor of the inductor structures. Degradation typically occurs when magnetic couplings generated by one inductor structure on another inductor structure negatively affect the electrical characteristics of the inductor structures. This problem can be even more pronounced when high frequency signals are conveyed in the integrated circuit die.

One solution to this problem is to increase the distance between inductor structures within the integrated circuit die. However, this solution is not always practical given that there is a limited amount space available on an integrated circuit die.

SUMMARY

Embodiments described herein include magnetically decoupled inductor structures and a method to manufacture the magnetically decoupled inductor structures. It should be appreciated that the embodiments can be implemented in numerous ways, such as a process, an apparatus, a system, a device, or a method. Several embodiments are described below.

In one embodiment, an integrated circuit die includes first and second inductor structures, a first ground conductor, a second ground conductor and a conductive trace. The first ground conductor provides a first ground pathway for the first inductor structure. The second ground conductor provides a second ground pathway for the second inductor structure. The conductive trace that couples the first and second ground conductors may magnetically decouple the first and second inductor structures. Additionally, the integrated circuit die may also include conductive guard ring structures that surround the first and second inductor structures. One of the conductive guard ring structures may be connected to the first grounding pathway while the other conductive guard ring structure is connected to the second grounding pathway, in one embodiment. The conductive guard ring structures may also magnetically decouple the first and second inductor structures.

In another embodiment, a method of manufacturing inductor structures includes a step to form first and second inductor structures in at least one layer of an integrated circuit die. The method may also include a step to form a first path to a ground for the first inductor structure in the at least one layer and a second path to the ground for the second inductor structure in the at least one layer. The second path to the ground is separate from the first path to ground, in one embodiment. Finally, the method also includes a step to connect the first and second paths to ground using a conductive trace.

Further features of the invention, its nature and various advantages will be more apparent from the accompanying drawings and the following detailed description of the preferred embodiments.

DETAILED DESCRIPTION

The following embodiments include magnetically decoupled inductor structures and a method of manufacturing the magnetically decoupled inductor structures. It will be obvious, to one skilled in the art, that the present exemplary embodiments may be practiced without some or all of these specific details. In other instances, well-known operations have not been described in detail in order not to unnecessarily obscure the present embodiments.

Throughout this specification, when an element is referred to as being "connected" or "coupled" to another element, it may be directly connected or coupled to the other element or electrically connected or coupled to the other element with yet another element interposed between them.

Figure 1:
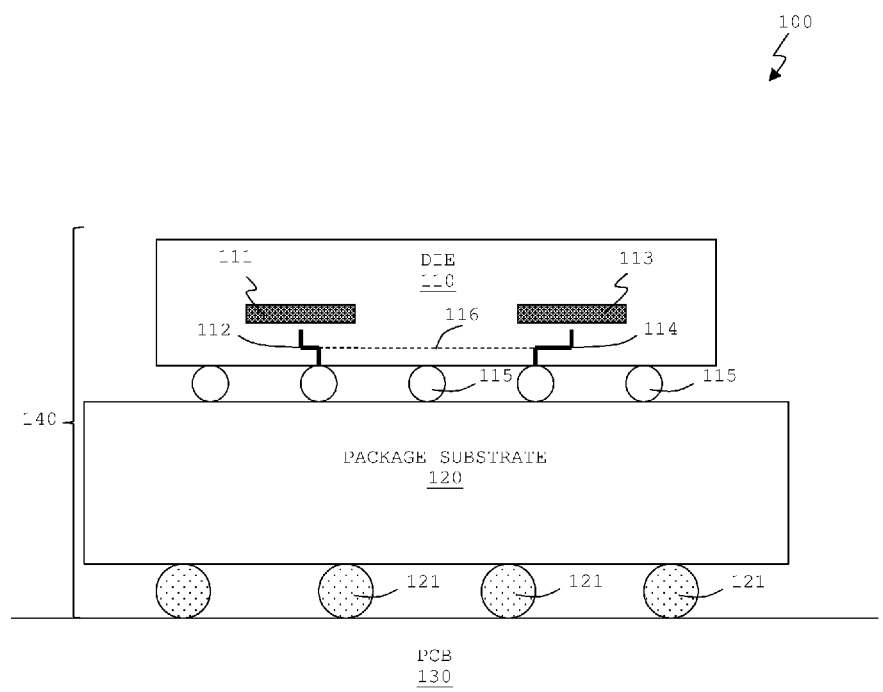
FIG. 1 shows an illustrative circuit system that includes an integrated circuit package mounted on a printed circuit board in accordance with one embodiment of the present invention.

FIG. 1, meant to be illustrative and not limiting, illustrates a circuit system that includes an integrated circuit package mounted on a printed circuit board in accordance with one embodiment of the present invention. Circuit system 100 includes integrated circuit package 140 mounted on printed circuit board 130.

Circuit system 100 may be a circuit within a communication system, a processing system, etc. In one exemplary embodiment, circuit system 100 is a part of a communication system utilized to handle transmissions of data through a network server or other device. In another suitable arrangement, circuit system 100 is a part of a processing system that may be utilized to perform high performance computing. Circuit system 100 may include multiple devices (e.g., microprocessor devices and memory devices) that may interact with one another if desired.

As shown in the embodiment of FIG. 1, circuit system 100 may include integrated circuit package 140. Integrated circuit package 140 may be a programmable logic device (PLD), for example, a field programmable gate array (FPGA) device. Alternatively, integrated circuit package 140 may be an application specific integrated circuit (ASIC) device or application specific standard products (ASSP) device, for example, a memory device or a microprocessor device.

As shown in the embodiment of FIG. 1, integrated circuit package 140 is mounted on printed circuit board 130 through solder balls 121. Solder balls 121 may be disposed at a bottom surface of integrated circuit package 140. Generally, solder balls 121 may be arranged in an array formation. Solder balls 121 may be utilized for: (i) transmitting signals in and out of integrated circuit package 140, (ii) providing power supply connections, or (iii) providing ground power supply connections to integrated circuit package 140.

As shown in the arrangement of FIG. 1, integrated circuit package 140 includes integrated circuit die 110 and package substrate 120. Generally, integrated circuit die 110 performs the core functions of integrated circuit package 140. Integrated circuit die 110 may include a semiconductor substrate (e.g., a silicon die) and a dielectric stack. It should be appreciated that the dielectric stack may include multiple dielectric layers and metal layers. Multiple circuit structures (e.g., complementary metal oxide semiconductor (CMOS) transistor, capacitor and inductor structures) may be formed inside of integrated circuit die 110. Among the circuit structures, active circuit structures (e.g., CMOS transistors) that form the functional circuitry for integrated circuit die 110 may be formed on the semiconductor substrate. Passive circuit structures (e.g., capacitor structures or inductor structures) may be formed on the metal layers and/or dielectric layers if desired.

It should be appreciated that the circuit structures forming the functional circuitry may perform any desired functions for integrated circuit die 110. For example, integrated circuit die 110 may have multiple functional circuits (e.g., transceiver circuitry) that transfer data between an ASIC or ASSP device (e.g., a memory controller device) and a memory device (i.e., an external device). The transceiver circuitry may be capable of transmitting a transmission signal (i.e., TX signal) and/or may receive a receiver signal (i.e., an RX signal). Alternatively, integrated circuit die 110 may have multiple programmable logic elements and programmable interconnects within an FPGA device that allow varied functions according to a user.

In the embodiment of FIG. 1, integrated circuit die 110 includes two inductor structures 111 and 113. Inductor structures 111 and 113 may form components of oscillator circuitry, voltage regulator circuitry, compensation circuitry, or other circuitry requiring an inductor. In one exemplary embodiment, inductor structures 111 and 113 (together with capacitor structures, not shown) may be utilized as electrical charge storages for voltage regulator circuitry. Inductor structures 111 and 113 may also be referred to as on-die inductors, for example.

Inductor structures 111 and 113 may be formed using metallic or other conductive materials. As shown in the embodiment of FIG. 1, inductor structures 111 and 113 are formed in one of the metal layers within the dielectric stack of die 110. Alternatively, inductor structures 111 and 113 may be formed in multiple metal layers of the dielectric stacks.

Generally, inductor structures 111 and 113 may be formed on the metal and dielectric layers that are adjacent to bumps 115 (e.g., upper metal and dielectric layers that are closer to the bottom surface of die 110 than the top surface of die 110 as shown in FIG. 1). This is because inductor structures 111 and 113 formed adjacent to bumps 115 may reduce the path distance for the inductive current to the ground. A short inductive current path may help to obtain high inductances for the respective inductor structures 111 and 113. In addition, the short distance between a common ground and inductor structures 111 and 113 may effectively reduce magnetic coupling between inductor structures 111 and 113.

As shown in the embodiment of FIG. 1, ground connection 112 is formed directly below inductor structure 111. Similarly, ground connection 114 may be formed directly below inductor structure 113. Ground connections 112 and 114 may be coupled to two respective bumps 115, both at a ground voltage level. If desired, ground connections 112 and 114 may not be physically coupled to the respective inductor structures 111 and 113. Ground connections 112 and 114 may also be referred to as on-die local grounds for the respective inductor structures 111 and 113 if desired. Ground connections 112 and 114 may help to reduce magnetic coupling between inductor structures 111 and 113 as the ground connections 112 and 114 provide a relatively short inductive current path. In one embodiment, ground connections 112 and 114 may be on the same metal layers as inductor structures 111 and 113 or on a metal layer directly adjacent the metal layer(s) that include inductor structures 111 and 113 (e.g., a layer directly above or below the layer of inductor structures 111 and 113). Inductor structures 111 and 113 may be formed on different layers if desired.

Referring still to FIG. 1, ground connections 112 and 114 may be electrically coupled together over conductive trace 116. In one embodiment, conductive trace 116 may be formed using metallic materials. Conductive trace 116 may be formed in the same metal layer as the layer in which the ends for ground connections 112 and 114 are located. Conductive trace 116 may serve to shorten an inductive current path between the two inductor structures 111 and 113 relative to when two inductor structures 111 and 113 are formed without conductive trace 116. As described above, a short inductive current path may reduce magnetic coupling between the two inductor structures 111 and 113. Therefore, shortening the ground connections 112 and 114 by way of conductive trace 116 may significantly reduce magnetic coupling between inductor structures 111 and 113. If desired, conductive trace 116 may also be referred to as a conductive decoupling trace.

Referring still to FIG. 1, integrated circuit die 110 is mounted on package substrate 120. Integrated circuit die 110 may be coupled to package substrate 120 through bumps 115. In one embodiment, bumps 115 may be controlled collapse chip connection (C4) bumps. Each bump 115 may be coupled to functional circuitry within integrated circuit die 110, in one embodiment. As shown in the embodiment of FIG. 1, one of the bumps 115 may be coupled to ground connection 112 and provide a ground voltage level for inductor structure 111, whereas another of the bumps 115 is coupled to ground connection 114 and provides the ground voltage level for inductor structure 113. The other remaining bumps 115 may be coupled to transmit signals (e.g., input/output (I/O) signals, transmission (TX) signals or receiver (RX) signals) for integrated circuit die 110.

Package substrate 120 may be an intermediary substrate that interconnects integrated circuit die 110 and printed circuit board 130. In one embodiment, package substrate 120 may be an organic substrate or a ceramic substrate. A complex package substrate 120 may include multiple metal layers. In one exemplary embodiment, package substrate 120 for an FPGA device may have more than five metal layers. A bottom surface of package substrate 120 may include solder balls 121. Solder balls 121, as described above, may couple die 110 to printed circuit board 130. In one embodiment, solder balls 121 may be ball grid array (BGA) balls.

Figure 2A:
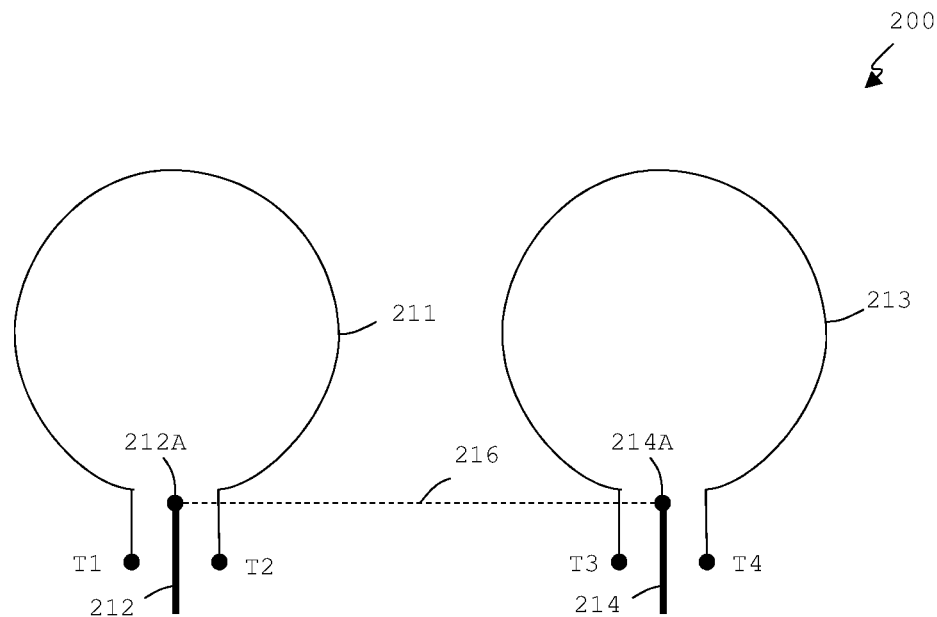
FIG. 2A shows a top-down view of an illustrative inductor circuit in accordance with one embodiment of the present invention.

FIG. 2A, meant to be illustrative and not limiting, illustrates a top-down view of an inductor circuit in accordance with one embodiment of the present invention. Inductor circuit 200 may include two circular shaped inductor structures 211 and 213 and ground connections 212 and 214. In one embodiment, the two circular shaped inductor structures 211 and 213 may be similar to the two inductor structures 111 and 113 of FIG. 1. Inductor structures 211 and 213 may, if desired, have other non-circular shapes. Inductor structures 211 and 213 need not have the same shape or size if desired.

Referring still to FIG. 2A, inductor structures 211 and 213 may be formed in a single metal layer near to the external die interconnections (e.g., bumps 115 of FIG. 1). The relatively short proximity to the external interconnections may help to reduce the distance for the inductive return current, which may help to reduce magnetic coupling between the two inductor structures 212 and 213.

Inductor structures 211 or 213 may include two terminals, each. As shown in the embodiment of FIG. 2A, inductor structures 211 includes terminals T1 and T2 and inductor structures 213 includes terminals T3 and T4. One of the terminals for inductor structures 211 and 213 may receive signals (i.e., I/O signals, TX signals or RX signals) whereas the other terminal for inductor structures 211 and 213 may transmit out the signals. For example, terminal T1 may receive signals and terminal T2 may transmit out the signals for inductor structure 211. Similarly, terminal T3 may receive signals and terminal T4 may transmit out the signals for inductor structure 213.

Inductor circuit 200 also includes ground connections 212 and 214. As shown in the embodiment of FIG. 2A, ground connection 212 may be formed adjacent to inductor structure 211 and ground connection 214 may be formed adjacent to inductor structure 213. Ground connections 212 and 214 may be similar to ground connections 112 and 114 of FIG. 1. It should be appreciated that ground connections 212 and 214 may be physically isolated from inductor structures 211 and 213, respectively (e.g., the ground connections may electrically couple the inductor structures to ground at a particular frequency but may not be in direct physical contact with the inductor structures). As described above, ground connection 212 provides an inductive return current path for inductor structure 211 and ground connection 214 may provide an inductive return current path for inductor structure 213. Similar to ground connections 112 and 114 of FIG. 1, ground connections 212 and 214 may be formed on the same metal layers as inductor structures 211 and 213 or on a metal layer immediately adjacent to the metal layers that include inductor structures 211 and 213.

Inductor circuit 200 may also include conductive trace 216. In one embodiment, conductive trace 216 may be similar to conductive trace 116 of FIG. 1. As shown in the embodiment of FIG. 2A, conductive trace 216 is represented by a dotted line. This is because conductive trace 216 may be formed in a different metal layer than inductor structures 211 and 213 and ground connections 212 and 214. As described in FIG. 1, shorting ground connections 212 and 214 through conductive trace 116 may significantly reduce magnetic coupling between inductor structures 211 and 213. As shown in the embodiment of FIG. 2A, conductive trace 216 may be coupled to ground connections 212 and 214 through conductive vias 212A and 214A, respectively (e.g., conductive vias extending vertically between the die layer on which trace 216 is located and the die layer on which conductors 212 and 214 are located). It should be appreciated that conductive vias 212A and 214A may transmit signal from a signal pathway in one metal layer to another signal pathway in an adjacent metal layer. In one exemplary embodiment, conductive vias 212A and 214A may be through-hole vias (THVs).

Figure 2B:
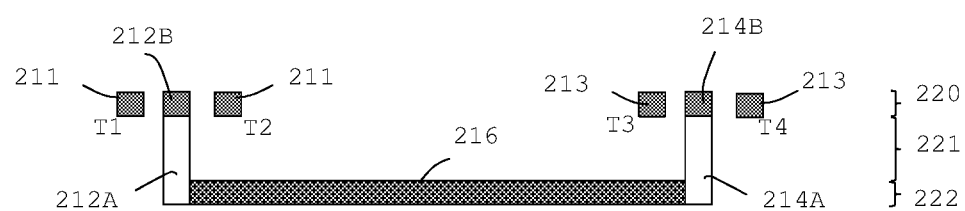
FIG. 2B shows a cross-sectional side view of the illustrative inductor circuit of FIG. 2A in accordance with one embodiment of the present invention.

FIG. 2B, meant to be illustrative and not limiting, illustrates a cross-sectional side view of inductor circuit 200 in accordance with one embodiment of the present invention. Cross-sectional view 200B shows that inductor structures 211 and 213 and ground connections 212 and 214 are formed in metal layer 220 whereas conductive trace 216 may be formed in metal layer 222. Ground connections 212 and 214 may be coupled to conductive trace 216 through their respective conductive vias 212A and 214A. Similar to metal layers described in FIG. 1, metal layers 220 and 222 and dielectric layer 221 may be formed near to external interconnections (e.g., bumps 151 of FIG. 1) in order to have a short return current path distance for the respective inductor structures 211 and 213 may effectively reduce magnetic coupling between inductor structures 211 and 213.

Figure 3:
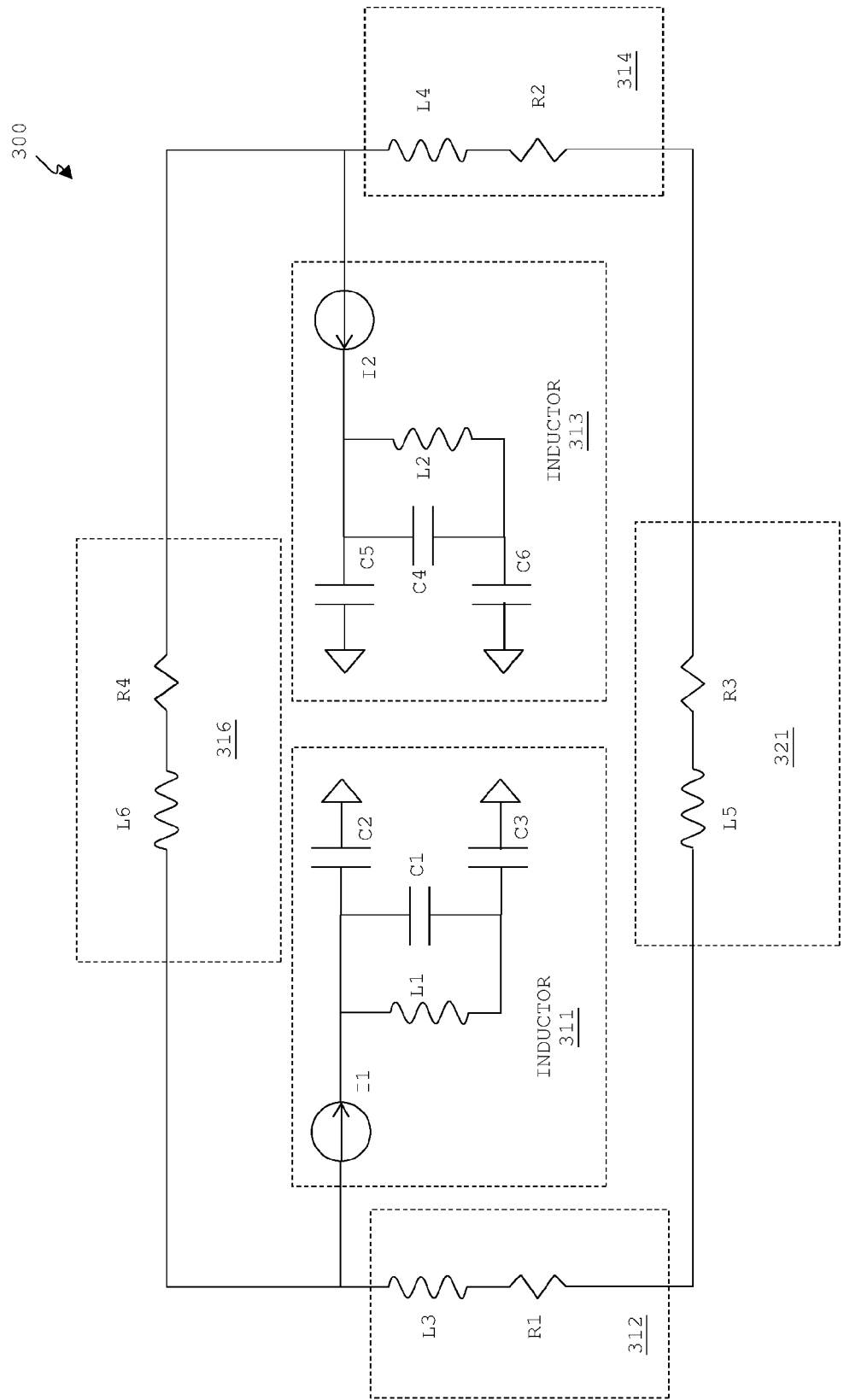
FIG. 3 shows an illustrative circuit having inductor circuitry in accordance with one embodiment of the present invention.

FIG. 3, meant to be illustrative and not limiting, illustrates a circuit that includes inductor circuitry in accordance with one embodiment of the present invention. In one embodiment, circuit 300 may be an equivalent circuit model representation for inductor circuit 200 of FIG. 2A. Circuit 300 includes two inductor structure circuits 311 and 313, two ground connection circuits 312 and 314, conductive trace circuit 316 and package circuit 321.

Referring still to FIG. 3, inductor structure circuit 311 may include current source I1, inductor L1, and three capacitors C1, C2 and C3. Similarly, inductor structure circuit 313 may include current source I2, inductor L2, and three capacitors C4, C5 and C6. In one embodiment, inductor structure circuits 311 and 313 may be circuit models for inductor structures 111 and 113, respectively, of FIG. 1 or inductor structures 211 and 213, respectively, of FIG. 2A.

As shown in the embodiment of FIG. 3, ground connection circuit 312 is coupled to inductor structure circuit 311 and ground connection circuit 314 is coupled to inductor structure circuit 313. In one embodiment, ground connection circuits 312 and 314 may represent ground connections 112 and 114, respectively, of FIG. 1 or ground connections 212 and 214, respectively, of FIG. 2A. As shown in the embodiment of FIG. 3, ground connection circuit 312 includes inductor L3 and resistor R1. Ground connection circuit 314 includes inductor L4 and resistor R2.

Package circuit 321 may include an inductor L5 and a resistor R3. Conductive trace circuit 316 may include an inductance L6 and a resistance R4. The inductance value across the inductive current return path may indicate magnetic couplings between two adjacent inductor structures. In one embodiment, an effective ground inductance ($L_{\textit{eff}1}$) when there is no conductive trace circuit 316 may be:

$$L_{\textit{eff}1} = L_{L3} + L_{L4} + L_{L5} \qquad (1)$$

where $L_{\textit{eff}1}$ is the effective ground inductance without conductive trace circuit 316, $L_{L3}$ is the inductance value for inductor L3, $L_{L4}$ is the inductance value for inductor L4, and $L_{L5}$ is the inductance value for inductor L5.

However, when circuit 300 includes conductive trace circuit 316, an effective ground inductance may be:

$$1/L_{eff2}=1/(L_{L3}+L_{L4}+L_{L5})+1/L_{L6} \qquad (2)$$

where $L_{eff2}$ is the effective ground inductance for circuit 300, $L_{L3}$ is the inductance value for inductor L3, $L_{L4}$ is the inductance value for inductor L4, $L_{L5}$ is the inductance value for inductor L5, and $L_{L6}$ is the inductance value for inductor L6. By comparing the equations (1) and (2), it can be seen that $L_{eff2}$ may be smaller than $L_{eff1}$, indicating reduced magnetic coupling between the two inductor structures.

Figure 4A:
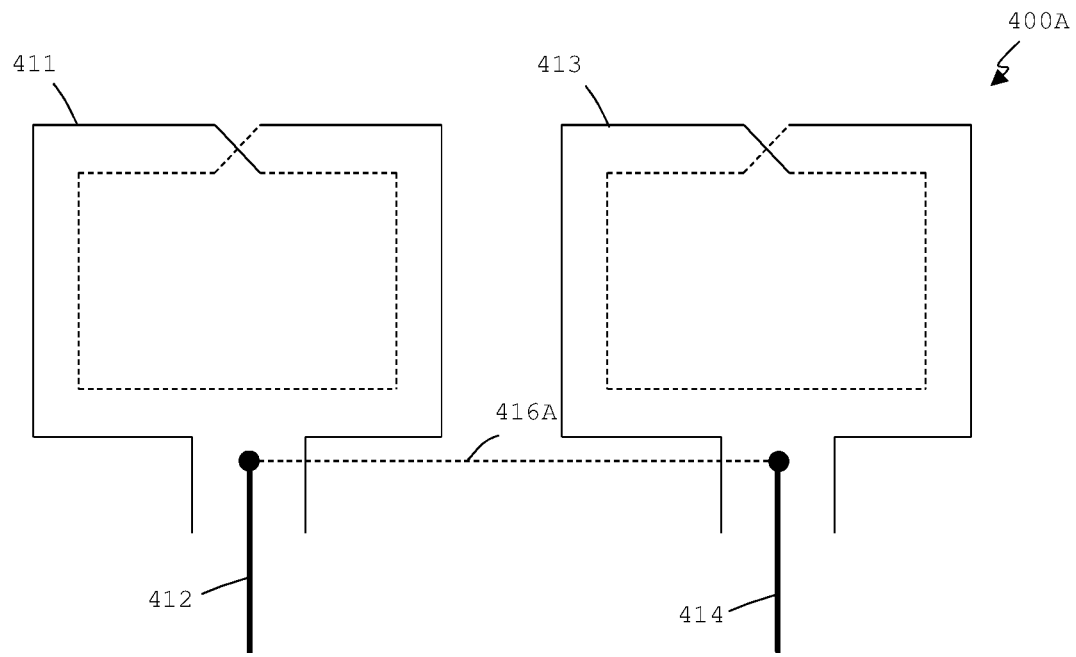
FIG. 4A shows an illustrative rectangular-shaped inductor circuit in accordance with one embodiment of the present invention.

FIG. 4A, meant to be illustrative and not limiting, illustrates a rectangle-shaped inductor circuit 400A in accordance with one embodiment of the present invention. Inductor circuit 400A includes two rectangular-shaped inductor structures 411 and 413. Inductors structures 411 and 413 are formed in two metal layers. As shown in the embodiment of the FIG. 4A, a portion of the inductor structures 411 and 413 (i.e., solid lines) is formed in one metal layer and another portion of inductor structures 411 and 413 is formed in another metal layer (i.e., dotted lines). These metal layers (the portion represented by solid lines and broken lines) may be formed in metal layers near external interconnections (e.g., bumps 151 of FIG. 1).

Additionally, inductor circuit 400A includes ground connections 412 and 414. As shown in the embodiment of FIG. 4A, ground connection 412 is for inductor structure 411 whereas ground connection 414 is for inductor structure 413. Ground connections 412 and 414 may be similar to ground connections 212 and 214 of FIG. 2A, and therefore for the sake of brevity will not be repeated again.

As shown in the embodiment of FIG. 4A, conductive trace 416A may be utilized to couple the two ground connections 412 and 414. Conductive trace 416A may be similar to conductive trace 116 of FIG. 1 or conductive trace 216 of FIG. 2A. In one embodiment, conductive trace 416A may be formed in a metal layer similar to portion of inductor structures 411 and 413 that is represented by the broken lines. In one embodiment, conductive trace 416A may shorten an inductive return current path and therefore may provide a significantly low magnetic coupling.

Figure 4B:
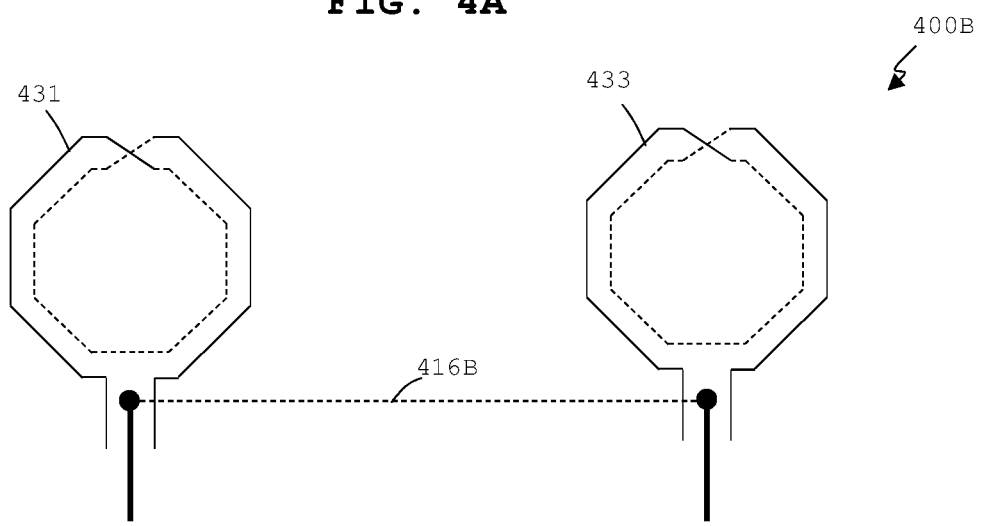
FIG. 4B shows an illustrative octagonal-shaped inductor circuit in accordance with one embodiment of the present invention.

FIG. 4B shows an octagonal-shaped inductor circuit 400B in accordance with one embodiment of the present invention. Inductor circuit 400B includes two octagonal-shaped inductor structures 431 and 433. Similar to FIG. 4A, octagonal-shaped inductor structures 431 and 433 may be formed in the two metal layers as shown by the solid lines and the broken lines. Similar to inductor circuit 400A of FIG. 4A, inductor circuit 400B may also include conductive trace 416B. In one embodiment, conductive trace 416B may be formed in the same metal layer as the portion of octagonal shaped inductor structures 431 and 433 that are represented by the broken lines.

Figure 5:
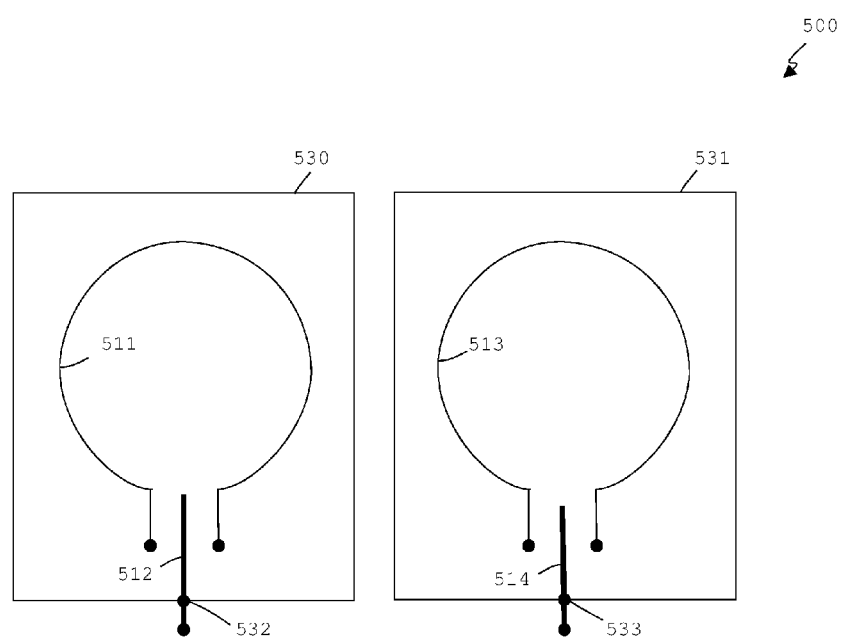
FIG. 5 shows an illustrative inductor circuit that includes closed loop guard rings in accordance with an embodiment of the present invention.

FIG. 5, meant to be illustrative and not limiting, illustrates an inductor circuit 500 that includes closed loop guard rings in accordance with the embodiment of the present invention. Inductor circuit 500 may include inductor structures 511 and 513, ground connections 512 and 514 and closed-loop guard rings 530 and 531. In one embodiment, the two inductor structures 511 and 513 may be similar to the two inductor structures 111 and 113 of FIG. 1 or two inductor structures 211 and 213 of FIG. 2A. Furthermore, ground connections 512 and 514 may be similar to ground connections 212 and 214 of FIG. 2A or ground connections 112 and 114 of FIG. 1.

As shown in the embodiment of FIG. 5, inductor structure 511 may be surrounded by closed-loop guard ring 530. Similarly, inductor structure 513 may be surrounded by closed-loop guard ring 531. Closed-loop guard ring 530 may be coupled to ground connection 512 through conductive via 532. Closed-loop guard ring 531 may be coupled to ground connection 514 through conductive via 533. Both closed-loop guard rings 530 and 531 are placed adjacent to one another. In one embodiment, the closed-loop guard rings 530 and 531 may further reduce magnetic coupling between the two inductor structures 511 and 513. However, guard rings 530 and 531 require a large space for each individual inductor structures 511 and 513.

Figure 6:
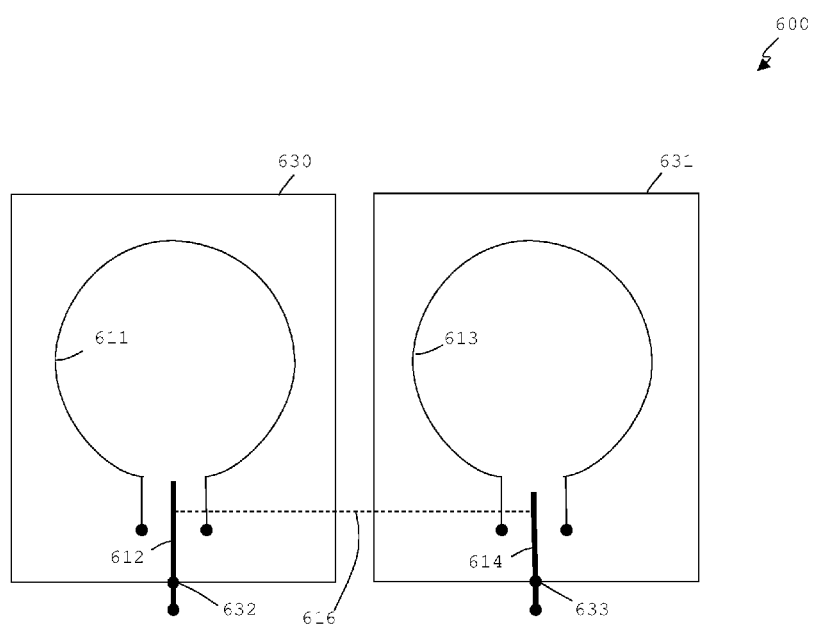
FIG. 6 shows an illustrative inductor circuit having additional conductive traces coupled to ground connections in accordance with an embodiment of the present invention.

FIG. 6, meant to be illustrative and not limiting, illustrates an inductor circuit 600 similar to FIG. 5 with an additional conductive trace coupling the two ground connections in accordance with the embodiment of the present invention. Inductor circuit 600 may include inductor structures 611 and 613, ground connections 612 and 614, closed-loop guard rings 630 and 631, and conductive trace 616. In one embodiment, inductor structures 611 and 613, ground connections 612 and 614, and closed-loop guard rings 630 and 631 may be similar to inductor structures 511 and 513, ground connections 512 and 514 and closed-loop guard rings 530 and 531, respectively. Therefore, details of inductor structures 611 and 613, ground connections 612 and 614 and closed-loop guard rings 630 and 631 is not repeated in here for the sake of brevity.

Conductive trace 616 may be similar to conductive trace 216 of FIG. 2A. In one embodiment, conductive trace 616 may be formed in a different metal layer than inductor structures 611 and 613, ground connections 612 and 614, and closed-loop guard rings 630 and 631. Guard rings 630 and 631 may be formed in any desired layer of the die and may include metal traces or other metal structures.

Figure 7:
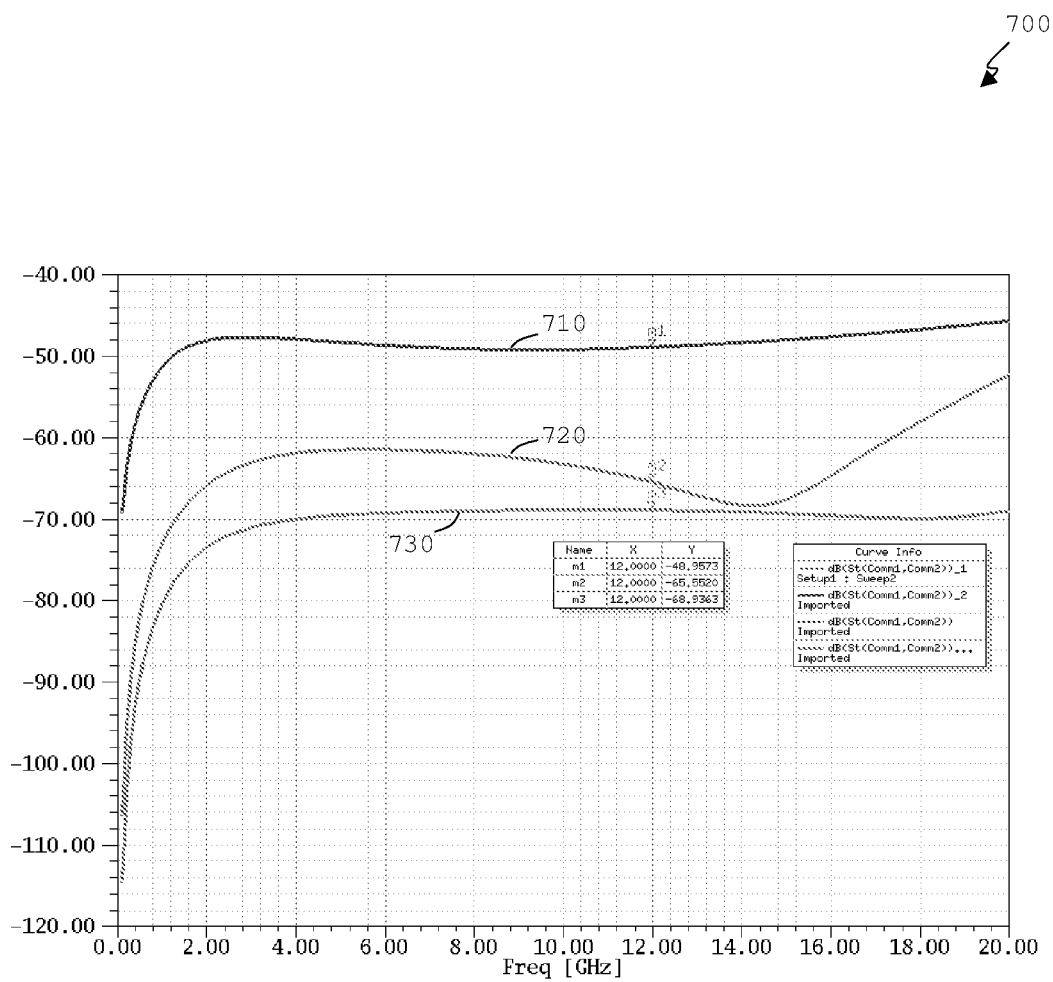
FIG. 7 shows three illustrative inductive coupling performance curves in accordance with one embodiment of the present invention.

FIG. 7, meant to be illustrative and not limiting, illustrates the magnetic coupling performance of different embodiments of inductor structures in accordance with one embodiment of the present invention. The three magnetic coupling performance curves 710, 720 and 730 may be measured relative to the frequencies of a signal transmitted through the inductor structures.

In one embodiment, magnetic coupling performance curve 710 may be for inductor structures that does not include any conductive trace (e.g., conductive trace 212 of FIG. 2A) or closed-loop guard ring (e.g., closed-loop guard ring 530 or 531 of FIG. 5 or closed-loop guard ring 630 or 631 of FIG. 6). Magnetic coupling performance curve 720 may be for inductor structures 211 and 213 as shown in inductor circuit 200 of FIG. 2A whereas magnetic coupling performance curve 730 may be for inductor structures 611 and 613 as shown in inductor circuit 600 of FIG. 6.

In the embodiment of FIG. 7, magnetic coupling performance curves 710, 720 and 730 at 12 gigahertz (GHz) may be respectively −48 decibel (dB), −65 dB and −68 dB. Therefore, inductor structures 611 and 613 of FIG. 6 may have the lowest magnetic coupling when compared to inductor structures that do not include any conductive trace or closed-loop guard ring (illustrated by magnetic coupling performance 710) and inductive structures 211 and 213 as shown in inductor circuit 200 of FIG. 2A (illustrated by magnetic coupling performance 720). In addition to that, inductor structures 211 and 213 as shown in inductor circuit 200 of FIG. 2A (illustrated by magnetic coupling performance curve 720) may have lower magnetic coupling compared to inductor structures that do not include any conductive trace or closed-loop guard ring (illustrated by magnetic coupling performance 710).

Comparing magnetic coupling performance curves 710, 720 and 730, it is apparent that the lowest magnetic coupling is achieved with inductor circuitry similar to inductor circuit 600 of FIG. 6. However, if space within the integrated circuit die is limited, inductor circuitry similar to inductor circuit 200 of FIG. 2 may be used instead to provide a performance increase over the conventional inductor structure represented by curve 710.

Figure 8:
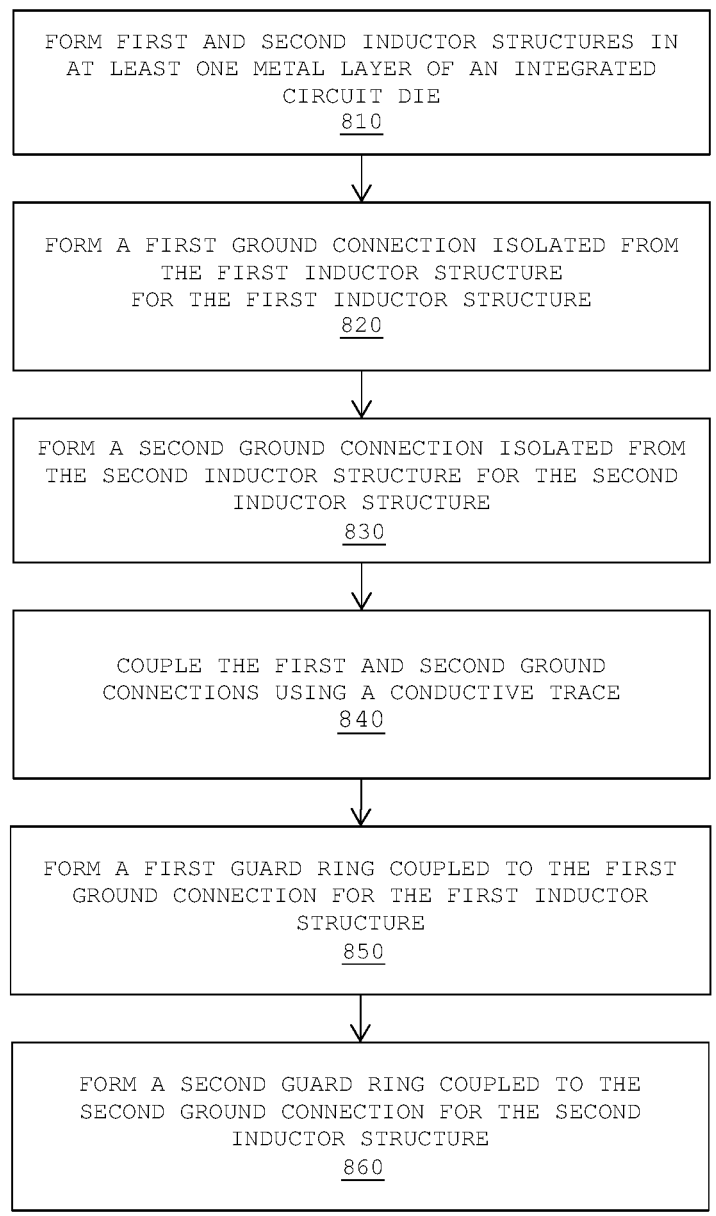
FIG. 8 shows an illustrative flowchart of steps for manufacturing inductor structures having reduced magnetic coupling in accordance with one embodiment of the present invention.

FIG. 8, meant to be illustrative and not limiting, illustrates a flowchart of a method for forming inductor structures in accordance with one embodiment of the present invention. In one embodiment, the inductor structures may be similar to inductor structures 111 and 113 of FIG. 1, inductor circuit 200 of FIG. 2A, inductor circuitry 500 of FIG. 5 or inductor circuitry 600 of FIG. 6.

At step 810, first and second inductor structures may be formed in at least one metal layer of an integrated circuit die. In one embodiment, the integrated circuit die may be similar to integrated circuit die 110 of FIG. 1. The inductor structures may be similar to inductor structures 111 and 113 of FIG. 1, inductor structures 211 and 213 of FIG. 2A, inductor structures 511 and 513 of FIG. 5 or inductor structures 611 and 613 of FIG. 6. The inductor structures may be formed in one metal layer (e.g., metal layer 220 of FIG. 2B) or in more than one layer (e.g., embodiments of FIGS. 4A and 4B).

At step 820, a first ground connection may be formed for the first inductor structure. However, the first ground connection is physically isolated from the first inductor structure. In one embodiment, the first ground connection may be similar to ground connection 112 of FIG. 1, ground connection 212 of FIG. 2A, ground connection 512 of FIG. 5 or ground connection 612 of FIG. 6.

At step 830, a second ground connection may be formed for the second inductor structure. Similar to the first ground connection, the second ground connection is also physically isolated from the second inductor structure. In one embodiment, the second ground connection may be similar to ground connection 114 of FIG. 1, ground connection 214 of FIG. 2A, ground connection 514 of FIG. 5 or ground connection 614 of FIG. 6.

At step 840, the first and second ground connections may be coupled through a conductive trace. The ground connection may be formed in a different metal layer than the metal layer having the inductor structures. In one embodiment, the conductive trace may be similar to conductive trace 216 of FIG. 2A, conductive trace 516 of FIG. 5 or conductive trace 616 of FIG. 6. At the completion of step 840, inductor circuitry similar to inductor circuit 200 may be formed.

Steps 850 and 860 may be performed to form inductor circuitry similar to inductor circuit 600 of FIG. 6. At step 850, a first guard ring is formed. The first guard ring is coupled to the first ground connection for the first inductor structure. In one embodiment, the first guard ring may be similar to closed-loop guard ring 630 of FIG. 6. At step 860, a second guard ring is formed. The second guard ring is coupled to the second ground connection for the second inductor structure. In one embodiment, the second guard ring may be similar to closed-loop guard ring 631 of FIG. 6. At the end of step 860, inductor circuitry similar to inductor circuit 600 of FIG. 6 may be formed.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit die, comprising:
    a first inductor structure having a first pair of inductor terminals;
    a second inductor structure having a second pair of inductor terminals;
    a first ground conductor that is disposed between the first pair of inductor terminals, wherein the first ground conductor provides a first ground pathway for the first inductor structure;
    a second ground conductor that is disposed between the second pair of inductor terminals, wherein the second ground conductor provides a second ground pathway for the second inductor structure; and
    a conductive trace that is coupled to the first and second ground conductors.

2. The integrated circuit die as defined in claim 1, wherein the first and second ground conductors do not contact the first and second inductor structures.

3. The integrated circuit die as defined in claim 1, wherein the first and second inductor structures are formed on a common layer of the integrated circuit die.

4. The integrated circuit die as defined in claim 3, wherein the conductive trace is formed on an additional layer of the integrated circuit die that is different from the common layer of the integrated circuit die on which the first and second inductor structures are formed.

5. The integrated circuit die as defined in claim 1, wherein the first and second inductor structures are formed on at least one metal layer of the integrated circuit die.

6. The integrated circuit die as defined in claim 1, wherein the first and second inductor structures each have a shape selected from the group of shapes consisting of: a circular shape, a rectangular shape, a hexagonal shape, and a spiral shape.

7. The integrated circuit die as defined in claim 1, further comprising:
   a conductive guard ring trace surrounding the first inductor structure that is electrically connected to the first ground conductor.

8. The integrated circuit die as defined in claim 1, further comprising:
   a conductive guard ring trace surrounding the second inductor structure that is electrically connected to the second ground conductor, wherein the conductive guard ring trace magnetically decouples the first and second inductor structures.

9. An integrated circuit device, comprising:
   a first inductor having a first pair of inductor terminals;
   a second inductor having a second pair of inductor terminals;
   a first conductive grounding pathway that is coupled to the first inductor and formed between the first pair of inductor terminals;
   a second conductive grounding pathway that is coupled to the second inductor and formed between the second pair of inductor terminals; and
   a conductive guard ring structure that surrounds the first inductor and that is connected to the first conductive grounding pathway.

10. The integrated circuit device as defined in claim 9, further comprising:
    an additional conductive guard ring structure that surrounds the second inductor and that is electrically connected to the second conductive grounding pathway.

11. The integrated circuit device as defined in claim 9, wherein the conductive guard ring structure and the first inductor are formed on a common metal layer of the integrated circuit device.

12. The integrated circuit device as defined in claim 9, wherein the first inductor surrounds a first area, the conductive guard ring structure surrounds a second area, and the second area is greater than the first area.

13. The integrated circuit device as defined in claim 9, further comprising:
    a conductive trace coupled between the first and second conductive grounding pathways.

14. The integrated circuit device as defined in claim 13, wherein the first and second inductors and the conductive guard ring structure are formed in a first substrate layer of the integrated circuit device and the conductive trace is formed in a second substrate layer of the integrated circuit device that is separate from the first substrate layer.

15. A method of manufacturing inductor structures, comprising:
    forming first and second inductor structures in at least one layer of an integrated circuit die, wherein the first and second inductor structures have respective first and second pairs of inductor terminals;
    forming a first path to ground for the first inductor structure between the first pair of inductor terminals;
    forming a second path to ground for the second inductor structure between the second pair of inductor terminals, wherein the second path to ground is separate from the first path to ground; and
    connecting the first and second paths to ground using a conductive trace.

16. The method as defined in claim 15, further comprising:
    forming a first guard ring that surrounds the first inductor structure in the at least one layer and connecting the first guard ring to the first path to ground.

17. The method as defined in claim 16, further comprising:
    forming a second guard ring that surrounds the second inductor structure in the at least one layer and connecting the second guard ring to the second path to ground.

18. The method as defined in claim 15, wherein forming the first and second inductor structures comprises forming the first and second inductor structures in a shape selected from the group of shapes consisting of: a circular shape, a rectangular shape, a hexagonal shape and a spiral shape.

19. The method as defined in claim 15, wherein the at least one layer where the first and second inductor structures are formed is adjacent to external interconnections of the integrated circuit die.

20. The method as defined in claim 15, wherein the first and second paths to ground are physically isolated from the first and second inductor structures.

* * * * *